United States Patent
Amanuma

(10) Patent No.: US 7,880,470 B2
(45) Date of Patent: Feb. 1, 2011

(54) SWITCHING CIRCUIT, SIGNAL OUTPUT DEVICE AND TEST APPARATUS

(75) Inventor: Seiji Amanuma, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/613,322

(22) Filed: Nov. 5, 2009

(65) Prior Publication Data

US 2010/0045115 A1 Feb. 25, 2010

Related U.S. Application Data

(63) Continuation of application No. 11/766,799, filed on Jun. 22, 2007, now abandoned.

(30) Foreign Application Priority Data

Mar. 29, 2007 (JP) ............................. 2007-088110

(51) Int. Cl.
G01R 31/02 (2006.01)
G01R 31/327 (2006.01)
(52) U.S. Cl. ...................................... 324/415; 324/537
(58) Field of Classification Search ................. 324/415, 324/537
See application file for complete search history.

(56) References Cited

U.S. PATENT DOCUMENTS 6,441,513 B1 * 8/2002 Mulhauser .................. 307/130
6,836,159 B2 * 12/2004 Wodnicki .................... 327/100
2004/0207454 A1 10/2004 Hidaka et al.

OTHER PUBLICATIONS

Korean Office Action for application No. 10-2008-0029281, dated Feb. 22, 2010, and English translation thereof, 8 pages.

* cited by examiner

Primary Examiner—Amy He
(74) Attorney, Agent, or Firm—Osha Liang LLP

(57) ABSTRACT

A test apparatus for a device under test (DUT) that includes a signal output device that outputs a signal according to a test signal and a detecting section that detects a signal output from the DUT that outputs a detection result. The signal output device includes an output port, a high-voltage side switching circuit between a first terminal and a second terminal, a low-voltage side switching circuit between a first terminal and a second terminal, and a control section that outputs the first and second control signals. Each of the high-voltage and the low-voltage side switching circuits include a plurality of switching devices serially connected between the first and second terminals. The plurality of switching devices are opened substantially in synchronization with each other, such that a voltage inputted to the first terminal is outputted from the second terminal by short-circuiting between the first and second terminals.

4 Claims, 8 Drawing Sheets

US 7,880,470 B2

SWITCHING CIRCUIT, SIGNAL OUTPUT DEVICE AND TEST APPARATUS

CROSS REFERENCE TO RELATED APPLICATIONS

This application is a divisional application and claims benefit under 35 U.S.C. §120 of U.S. patent application Ser. No. 11/766,799, filed on Jun. 22, 2007, entitled "Switching Circuit, Signal Output Device and Test Apparatus," in the name of Seiji Amanuma et al. This patent application claims priority from a Japanese Patent Application No. 2007-0881 10 filed on Mar. 29, 2007 the contents of which are incorporated herein by reference.

BACKGROUND

1. Technical Field

The present invention relates to a switching circuit, a signal output device, and a test apparatus. More particularly, the present invention relates to a switching circuit that opens or short-circuits between a first terminal and a second terminal in accordance with a control signal, and a signal output device and a test apparatus using this switching circuit.

2. Related Art

There has been known a FET with a high withstand voltage that can switch a high voltage (for example, 1000V). A switching circuit using such a FET can switch between two terminals, into which a voltage of several hundred volts is injected, at high speed (for example, see "Japanese Patent Application Publication 2001-284097" and "Tamotsu Inaba, Foundation and Practice of Power MOSFET Application, CQ publication, Nov. 1, 2004, p. 146").

SUMMARY

Meanwhile, when a voltage (for example, 2000V or more) exceeding a withstand voltage capable of being realized by FET is injected between two terminals, switching should be performed between the two terminals by means of a switching circuit that uses a mechanical relay or the like with a higher withstand voltage in place of the FET. However, the mechanical relay has an extremely slow switching speed in comparison to FET. Therefore, the switching circuit using the mechanical relay can be used in an apparatus, for example, a signal generating apparatus or the like that requires switching a high voltage.

Therefore, it is an object of some aspects of the present invention to provide a switching circuit, a signal output device, and a test apparatus that can solve the foregoing problems. The above and other objects can be achieved by combinations described in the independent claims. The dependent claims define further advantageous and exemplary combinations of the present invention.

To solve the problem, according to the first aspect related to the innovations herein, one exemplary switching circuit that opens or short-circuits between a first terminal and a second terminal in accordance with a control signal. The switching circuit may include: a plurality of switching devices that is serially connected between the first terminal and the second terminal and each of which is opened or short-circuited in accordance with a provided control voltage; and a plurality of control circuits that is provided one-to-one corresponding to the plurality of switching devices, each of which provides a control voltage according to the control signal to the corresponding switching device, and that opens and short-circuits the plurality of switching devices in synchronization with each other. The plurality of control circuits may be provided one-to-one corresponding to the plurality of switching devices.

According to the second aspect related to the innovations herein, one exemplary signal output device that outputs an output signal according to an input signal expressing a logical value. The signal output device may include: an output port that outputs the output signal; a high-voltage side switching circuit that opens or short-circuits between a first terminal connected to a high-voltage side reference voltage generating port for outputting a high-voltage side reference voltage and a second terminal connected to the output port in accordance with a first control signal; a low-voltage side switching circuit that opens or short-circuits between a first terminal connected to the output port and a second terminal connected to a low-voltage side reference voltage generating port for outputting a low-voltage side reference voltage lower than the high-voltage side reference voltage in accordance with a second control signal; and a control section that outputs the first control signal and the second control signal according to the input signal causing the high-voltage side switching circuit to be opened when the low-voltage side switching circuit is being short-circuited and causing the low-voltage side switching circuit to be opened when the high-voltage side switching circuit is being short-circuited, and each of the high-voltage side switching circuit and the low-voltage side switching circuit may include: a plurality of switching devices that is serially connected between the first terminal and the second terminal and each of which is opened or short-circuited in accordance with a provided control voltage; and a plurality of control circuits that is provided corresponding to the plurality of switching devices, each of which provides a control voltage according to the control signal to the corresponding switching device, and that opens and short-circuits the plurality of switching devices in synchronization with each other.

According to the third aspect related to the innovations herein, one exemplary test apparatus that tests a device under test. The test apparatus may include: a signal output device that outputs an output signal according to a test signal to the device under test; and a detecting section that detects a signal output from the device under test in accordance with the output signal and outputs a detection result, the signal output device may include: an output port that outputs the output signal; a high-voltage side switching circuit that opens or short-circuits between a first terminal connected to a high-voltage side reference voltage generating port for outputting a high-voltage side reference voltage and a second terminal connected to the output port in accordance with a first control signal; a low-voltage side switching circuit that opens or short-circuits between a first terminal connected to the output port and a second terminal connected to a low-voltage side reference voltage generating port for outputting a low-voltage side reference voltage lower than the high-voltage side reference voltage in accordance with a second control signal; and a control section that outputs the first control signal and the second control signal according to a logical value shown by the input signal causing the high-voltage side switching circuit to be opened when the low-voltage side switching circuit is being short-circuited and causing the low-voltage side switching circuit to be opened when the high-voltage side switching circuit is being short-circuited, and each of the high-voltage side switching circuit and the low-voltage side switching circuit may include: a plurality of switching devices that is serially connected between the first terminal and the second terminal and each of which is opened or short-circuited in accordance with a provided control voltage;

and a plurality of control circuits that is provided corresponding to the plurality of switching devices, each of which provides a control voltage according to the control signal to the corresponding switching device, and that opens and short-circuits the plurality of switching devices in synchronization with each other.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
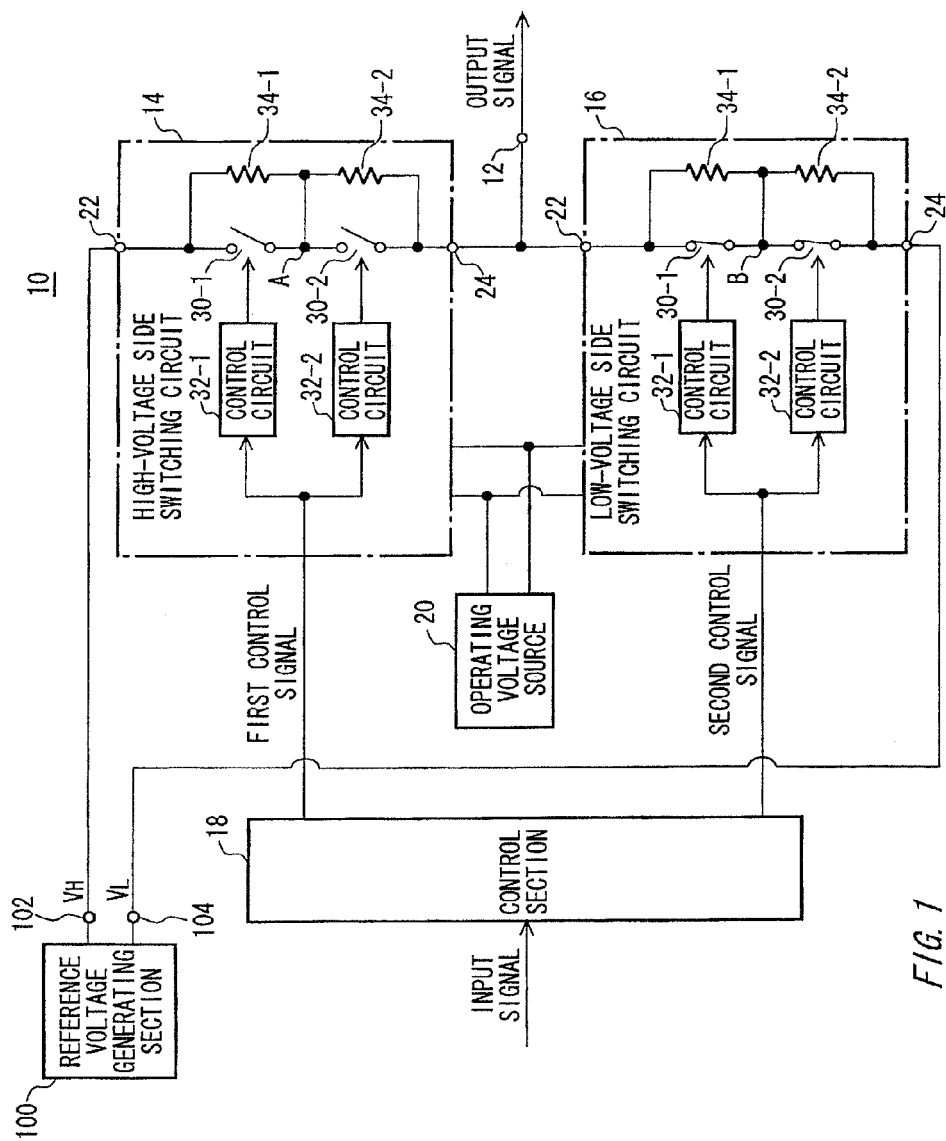
FIG. 1 shows a configuration of a signal output device 10 according to an embodiment of the present invention along with a reference voltage generating section 100.

FIG. 1 shows a configuration of a signal output device 10 according to the present embodiment along with a reference voltage generating section 100. The signal output device 10 inputs an input signal expressing a logical value from an outside, and outputs an output signal according to the input signal.

The signal output device 10 is supplied with a high-voltage side reference voltage VH and a low-voltage side reference voltage VL output from the reference voltage generating section 100 provided in the outside. The reference voltage generating section 100 outputs the high-voltage side reference voltage VH from a high-voltage side reference voltage generating port 102, and outputs the low-voltage side reference voltage VL lower than the high-voltage side reference voltage VH from a high-voltage side reference voltage generating port 104. As an example, the signal output device 10 may output the high-voltage side reference voltage VH and the low-voltage side reference voltage VL that have a voltage difference above 2000V. In the present embodiment, the signal output device 10 outputs an output signal of the high-voltage side reference voltage VH or the low-voltage side reference voltage VL in accordance with a logic (for example, High logic or Low logic) of an input signal.

The signal output device 10 includes an output port 12, a high-voltage side switching circuit 14, a low-voltage side switching circuit 16, a control section 18, and an operating voltage source 20. The output port 12 outputs the output signal to an outside. In the present embodiment, electric potential of the output port 12 is switched to the high-voltage side reference voltage VH or the low-voltage side reference voltage VL in accordance with a logic of the input signal.

The high-voltage side switching circuit 14 and the low-voltage side switching circuit 16 opens or short-circuits between a first terminal 22 and a second terminal 24 in accordance with a control signal. More in detail, the high-voltage side switching circuit 14 opens or short-circuits between the first terminal 22 connected to the high-voltage side reference voltage generating port 102 and the second terminal 24 connected to the output port 12 in accordance with a first control signal. The low-voltage side switching circuit 16 opens or short-circuits between the first terminal 22 connected to the output port 12 and the second terminal 24 connected to the high-voltage side reference voltage generating port 104 in accordance with a second control signal.

Each of the high-voltage side switching circuit 14 and the low-voltage side switching circuit 16 has a plurality of switching devices 30, a plurality of control circuits 32, and a plurality of resistors 34. As an example, the high-voltage side switching circuit 14 and the low-voltage side switching circuit 16 may have two switching devices 30 (30-1 and 30-2), two control circuits 32 (32-1 and 32-2), and two resistors 34 (34-1 and 34-2). 100241 The plurality of switching devices 30 is serially connected between the first terminal 22 and the second terminal 24. Each of the plurality of switching devices 30 is opened or short-circuited in accordance with a given control voltage. On condition that the sum of withstand voltages of the plurality of switching devices 30 is higher than a potential difference between the high-voltage side reference voltage VH and the low-voltage side reference voltage VL, a withstand voltage of each of the plurality of switching devices 30 may as an example be smaller than the potential difference between the high-voltage side reference voltage VH and the low-voltage side reference voltage VL.

The plurality of control circuits 32 is provided one-to-one corresponding to the plurality of switching devices 30. For example, the first control circuit 32-1 is provided corresponding to the first switching device 30-1 and the second control circuit 32-2 is provided corresponding to the second switching device 30-2. Each of the plurality of control circuits 32 gives a control voltage according to the control signal input to this high-voltage side switching circuit 14 to the corresponding switching device 30. More in detail, each of the plurality of control circuits 32 of the high-voltage side switching circuit 14 gives a control voltage according to the first control signal to the corresponding switching device 30. Each of the plurality of control circuits 32 of the low-voltage side switching circuit 16 gives a control voltage according to the second control signal to the corresponding switching device 30. LO0261 Then, the plurality of control circuits 32 opens and short-circuits the plurality of switching devices 30 in synchronization with one another. As an example, the plurality of control circuits 32 causes all the plurality of switching devices 30 serially connected between the first terminal 22 and the second terminal 24 to be simultaneously opened or be simultaneously short-circuited. According to this, resistance values of the plurality of switching devices 30 are synchronously changed from zero to infinity during transition from a short-circuit state to an open state. Moreover, the resistance values of the plurality of switching devices 30 are synchronously changed from infinity to zero during transition from an open state to a short-circuit state.

As a result, mutual resistance values of the plurality of switching devices 30 are generally same during transiting a switching state. Therefore, each of the plurality of switching devices 30 is supplied with an equivalent voltage obtained by dividing a voltage injected between the first terminal 22 and the second terminal 24 by the number of the switching devices 30 during transiting a switching state. In other words, the plurality of control circuits 32 can make it possible not to apply an overvoltage to any one of the plurality of switching devices 30 during transiting a switching state.

The plurality of resistors 34 is provided one-to-one corresponding to the plurality of switching devices 30. For example, the first resistor 34-1 is provided corresponding to the first switching device 30-1 and the second resistor 34-2 is provided corresponding to the second switching device 30-2. Each of the plurality of resistors 34 is connected parallel with the corresponding switching device 30. Then, mutual resistance values of the plurality of resistors 34 are substantially same.

According to the plurality of resistors 34, in a stable open state after the plurality of switching devices 30 transits from a short-circuit state to an open state, an equivalent voltage obtained by dividing a voltage injected between the first terminal 22 and the second terminal 24 by the number of the resistors 34 can be applied to each of the plurality of switching devices 30. In other words, the plurality of resistors 34 can make it possible not to apply an overvoltage to any one of the plurality of switching devices 30 in a stable open state.

As described above, in the high-voltage side switching circuit 14 and the low-voltage side switching circuit 16, an equivalent voltage obtained by dividing a voltage injected between the first terminal 22 and the second terminal 24 in an open state by the number of the switching devices 30 is applied to each of the plurality of switching devices 30 serially connected between the first terminal 22 and the second terminal 24. Therefore, the high-voltage side switching circuit 14 and the low-voltage side switching circuit 16 can switch between the first terminal 22 and the second terminal 24 by means of the switching device 30 having a withstand voltage lower than a voltage applied between the first terminal 22 and the second terminal 24 in an open state.

For example, the high-voltage side switching circuit 14 and the low-voltage side switching circuit 16 can switch between the first terminal 22 and the second terminal 24 by means of the switching device 30 having a withstand voltage (for example, below 1000V) smaller than a voltage difference (for example, 2000V) generated between the high-voltage side reference voltage VH and the low-voltage side reference voltage VL. According to this, for example, the high-voltage side switching circuit 14 and the low-voltage side switching circuit 16 can switch a high voltage by means of the high-speed and cheap switching device 30 such as a field-effect transistor.

The control section 18 outputs the first control signal and the second control signal in accordance with a logical value of the input signal. More in detail, the control section 18 opens the high-voltage side switching circuit 14 when the low-voltage side switching circuit 16 is short-circuited, and outputs the first control signal and the second control signal that make the low-voltage side switching circuit 16 be opened when the high-voltage side switching circuit 14 is short-circuited. According to this, the high-voltage side switching circuit 14 and the low-voltage side switching circuit 16 have switching states operating reversely with respect to each other.

Furthermore, the control section 18 may, as an example, output the first and the second control signals that make them go through a state where the low-voltage side switching circuit 16 is opened and the high-voltage side switching circuit 14 is opened, when a state transition is performed from a state where the low-voltage side switching circuit 16 is short-circuited and the high-voltage side switching circuit 14 is opened a state where the low-voltage side switching circuit 16 is opened and the high-voltage side switching circuit 14 is short-circuited. Additionally, the control section 18 may, as an example, output the first and the second control signals that make them go through a state where the low-voltage side switching circuit 16 is opened and the high-voltage side switching circuit 14 is opened, when a state transition is performed from a state where the low-voltage side switching circuit 16 is opened and the high-voltage side switching circuit 14 is short-circuited to a state where the low-voltage side switching circuit 16 is short-circuited and the high-voltage side switching circuit 14 is opened. According to this, according to the control section 18, although deviance occurs in switching operations between the low-voltage side switching circuit 16 and the high-voltage side switching circuit 14, it is possible to remove a state where both of the low-voltage side switching circuit 16 and the high-voltage side switching circuit 14 are simultaneously short-circuited.

The operating voltage source 20 generates an operating voltage, and supplies the voltage to the control circuits 32 within the high-voltage side switching circuit 14 and the low-voltage side switching circuit 16. The control circuits 32 within the high-voltage side switching circuit 14 and the low-voltage side switching circuit 16 operate using the operating voltage supplied from the operating voltage source 20 as a power source.

According to the signal output device 10 with such a configuration, the high-voltage side switching circuit 14 that opens or short-circuits between the high-voltage side reference voltage generating port 102 and the output port 12 and the low-voltage side switching circuit 16 that opens or short-circuits between the high-voltage side reference voltage generating port 104 and the output port 12 have switching states operating reversely with respect to each other in accordance with the input signal. According to this, the signal output device 10 can output an output signal, which is changed into the high-voltage side reference voltage VH or the low-voltage side reference voltage VL in accordance with the logical value (for example, High logic or Low logic) of the input signal, from the output port 12.

Furthermore, the signal output device 10 opens or short-circuits between the high-voltage side reference voltage generating port 102 and the output port 12 and between the high-voltage side reference voltage generating port 104 and the output port 12 by means of the high-voltage side switching circuit 14 and the low-voltage side switching circuit 16. According to this, the signal output device 10 can output an output signal with a voltage swing larger than a withstand voltage of the switching devices 30 within the high-voltage side switching circuit 14 and the low-voltage side switching circuit 16. For example, the signal output device 10 can output an output signal with a voltage swing, for example, above 2000V by means of the high-voltage side switching circuit 14 and the low-voltage side switching circuit 16 using the switching devices 30 with a withstand voltage, for example, below 1000V.

Figure 2:
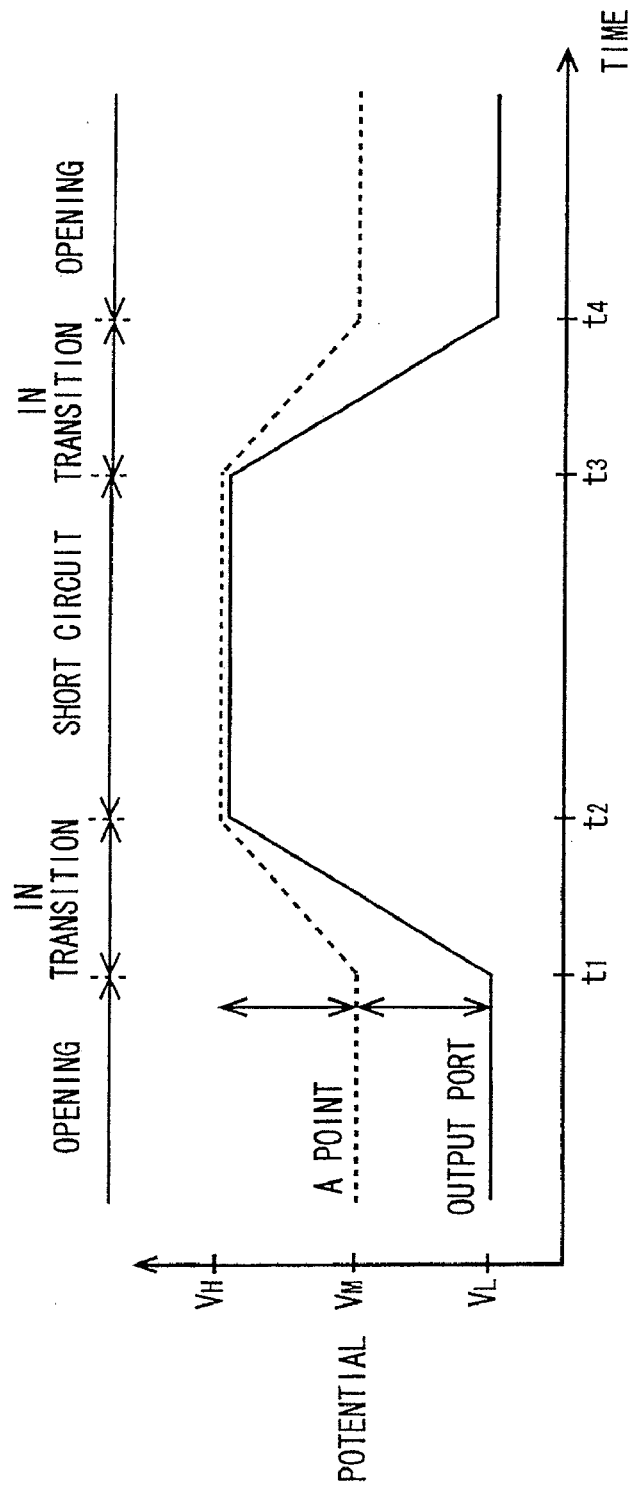
FIG. 2 shows a change of electric potential of an output port 12 and an A point shown in FIG. 1 when there is not a skew between a plurality of control circuits 32 within a high-voltage side switching circuit 14.
Figure 3:
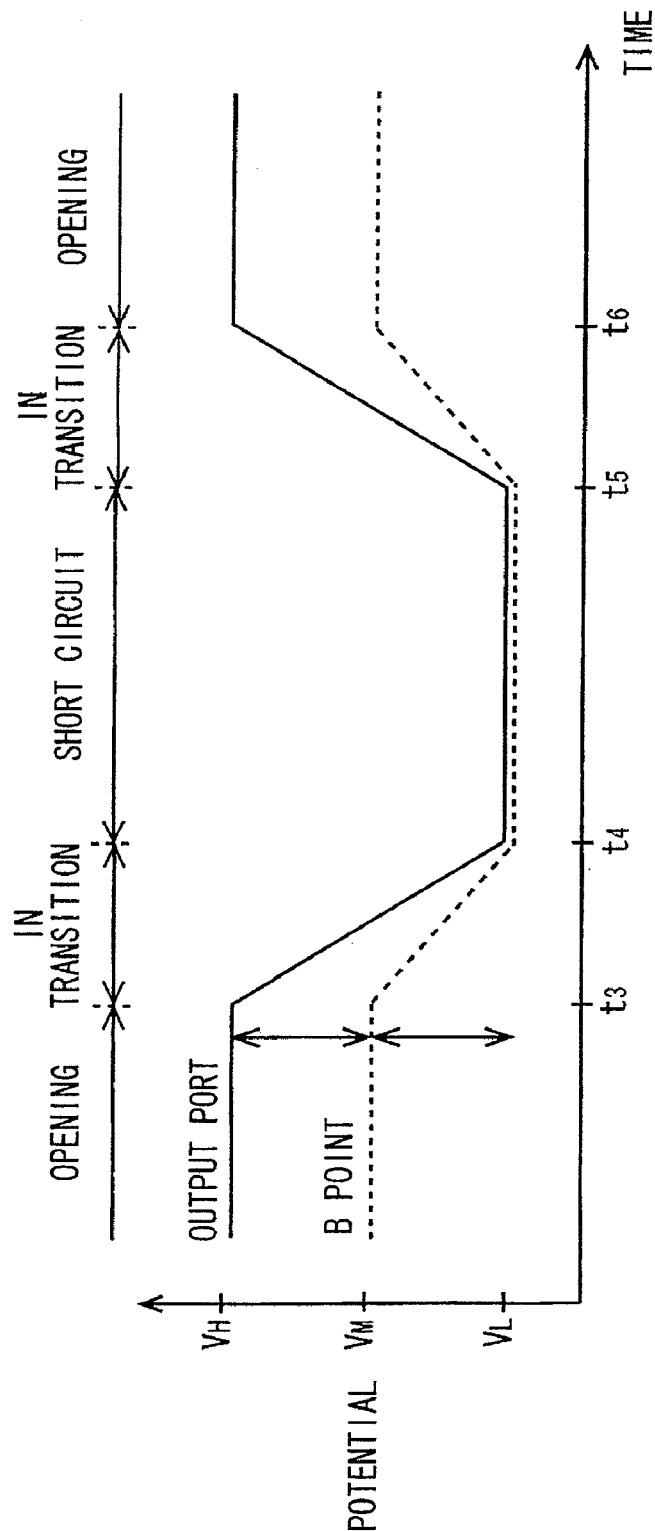
FIG. 3 shows a change of electric potential of an output port 12 and a B point of a low-voltage side switching circuit 16 when there is not a skew between a plurality of control circuits 32 within the low-voltage side switching circuit 16.

FIG. 2 shows a change of electric potential of the output port 12 and an A point shown in FIG. 1 when there is not a skew between the plurality of control circuits 32 within the high-voltage side switching circuit 14. FIG. 3 shows a change of electric potential of the output port 12 and a B point shown in FIG. 1 when there is not a skew between the plurality of control circuits 32 within the low-voltage side switching circuit 16. In addition, the A point shown in FIG. 1 shows a connecting point between the first switching device 30-1 and the second switching device 30-2 within the high-voltage side switching circuit 14 when the high-voltage side switching circuit 14 has the two switching devices 30 (the first switching device 30-1 and the second switching device 30-2). The B point shown in FIG. 2 shows a connecting point between the first switching device 30-1 and the second switching device 30-2 within the low-voltage side switching circuit 16 when the low-voltage side switching circuit 16 has the two switching devices 30 (the first switching device 30-1 and the second switching device 30-2).

As shown in FIG. 2, electric potential of the output port 12 becomes the low-voltage side reference voltage VL in an open state of the high-voltage side switching circuit 14 (before time t1 and after time t4), and becomes the high-voltage side reference voltage VH in a short-circuit state of the high-voltage side switching circuit 14 (from time t2 to time t3). Moreover, the electric potential of the output port 12 is substantially linearly changed from the low-voltage side reference voltage VL to the high-voltage side reference voltage VH during transition from an open state to a short-circuit state of the high-voltage side switching circuit 14 (from time t1 to time t2). The electric potential of the output port 12 is substantially linearly changed from the high-voltage side reference voltage VH to the low-voltage side reference voltage VL during transition from a short-circuit state to an open state of the high-voltage side switching circuit 14 (from time t3 to time t4).

Moreover, electric potential of the A point becomes a midpoint potential VM between the low-voltage side reference voltage VL and the high-voltage side reference voltage VH in an open state of the high-voltage side switching circuit 14 (before time t1 and after time t4), and the high-voltage side reference voltage VH in a short-circuit state of the high-voltage side switching circuit 14 (from time t2 to time t3). Moreover, the electric potential of the A point is substantially linearly changed from the midpoint potential VM to the high-voltage side reference voltage VH during transition from an open state to a short-circuit state of the high-voltage side switching circuit 14 (from time t1 to time t2). The electric potential of the A point is substantially linearly changed from the high-voltage side reference voltage VH to the midpoint potential VM during transition from a short-circuit state to an open state of the high-voltage side switching circuit 14 (from time t3 to time t4).

As shown in FIG. 3, electric potential of the output port 12 becomes the high-voltage side reference voltage VH in an open state of the low-voltage side switching circuit 16 (before time t3 and after time t6), and becomes the low-voltage side reference voltage VL in a short-circuit state of the low-voltage side switching circuit 16 (from time t4 to time t5). Moreover, the electric potential of the output port I 2 is substantially linearly changed from the high-voltage side reference voltage VH to the low-voltage side reference voltage VL during transition from an open state to a short-circuit state of the low-voltage side switching circuit 16 (from time t3 to time t4). The electric potential of the output port 12 is substantially linearly changed from the low-voltage side reference voltage VL to the high-voltage side reference voltage VH during transition from a short-circuit state to an open state of the low-voltage side switching circuit 16 (from time t5 to time t6).

Moreover, the electric potential of the B point becomes a midpoint potential VM in an open state of the low-voltage side switching circuit 16 (before time t3 and after time t6), and becomes the low-voltage side reference voltage VL in a short-circuit state of the low-voltage side switching circuit 16 (from time t4 to time t5). Moreover, the electric potential of the B point is substantially linearly changed from the midpoint potential VM to the low-voltage side reference voltage VL during transition from an open state to a short-circuit state of the low-voltage side switching circuit 16 (from time t3 to time t4). The electric potential of the B point is substantially linearly changed from the low-voltage side reference voltage VL to the midpoint potential VM during transition from a short-circuit state to an open state of the low-voltage side switching circuit 16 (from time t5 to time t6).

Here, each of the plurality of control circuits 32 within the high-voltage side switching circuit 14 and the low-voltage side switching circuit 16 has a predetermined delay time from changing the logical value of the input control signal to providing a control voltage according to the after-change control signal to the corresponding switching device 30. When there is not deviance (a skew) of a delay time between the plurality of control circuits 32, in the plurality of switching devices 30 as shown in FIG. 2 and FIG. 3, switching times (transition periods of switching state) from the change of the given control voltage to finishing the transition of switching state are synchronized with respect to one another.

Figure 4:
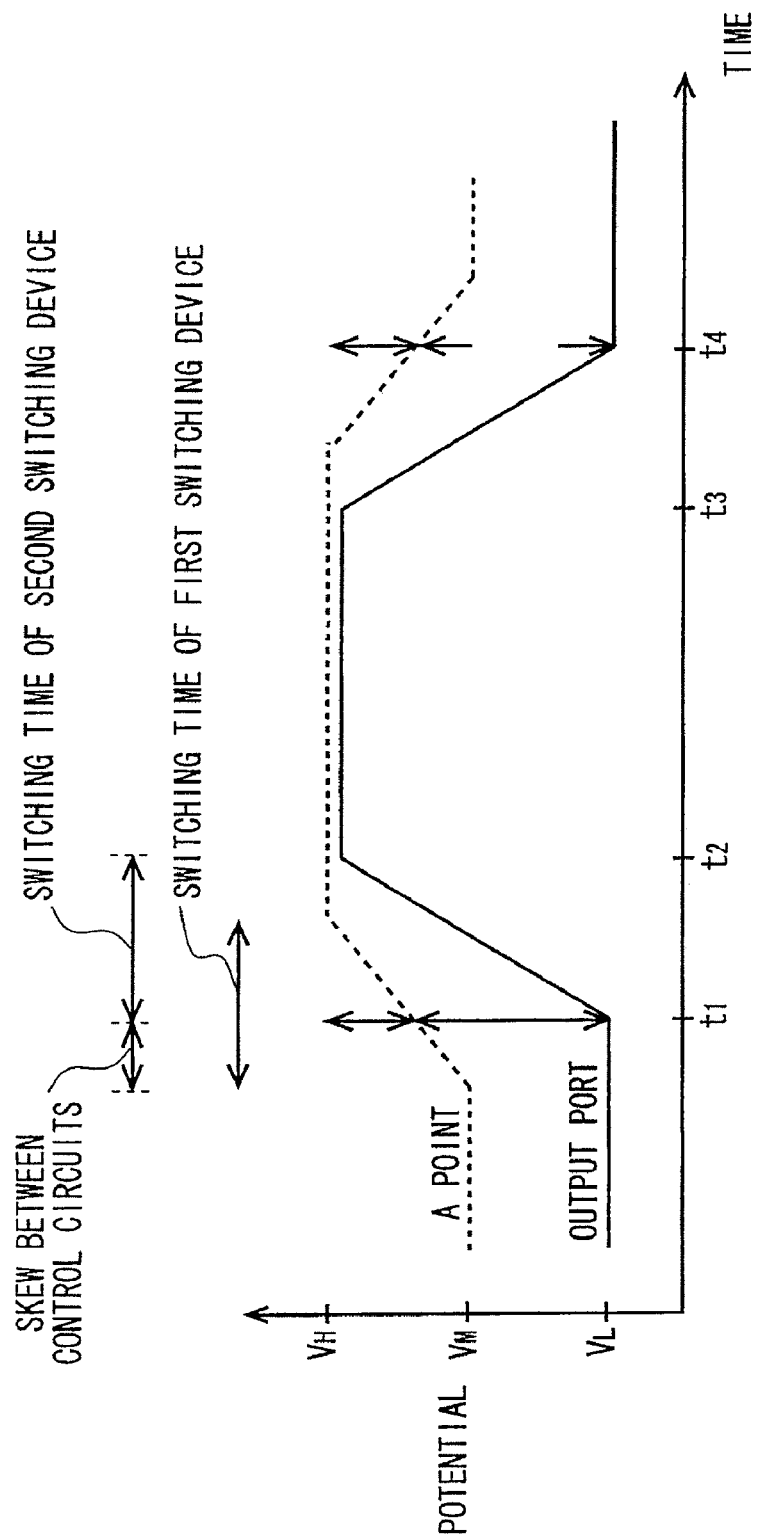
FIG. 4 shows a change of electric potential of an output port 12 and an A point shown in FIG. 1 when there is a skew between a plurality of control circuits 32 within a high-voltage side switching circuit 14.
Figure 5:
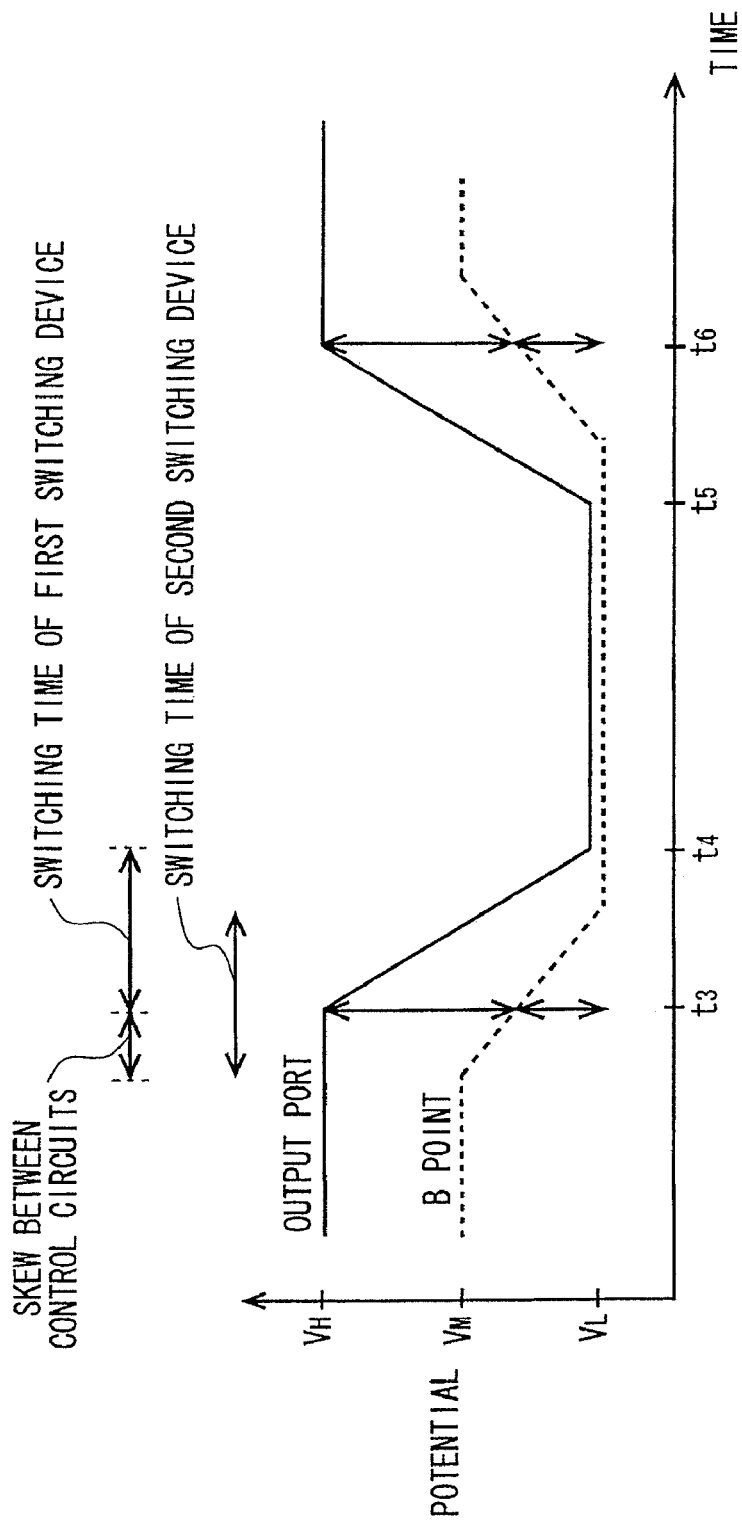
FIG. 5 shows a change of electric potential of an output port 12 and a B point of a low-voltage side switching circuit 16 when there is a skew between a plurality of control circuits within the low-voltage side switching circuit 16.

In the plurality of switching devices 30, resistance values during transition of switching state are similarly changed when the switching times are synchronized with respect to one another. In other words, in the plurality of switching devices 30, resistance values at arbitrary timings become equal to one another when switching times are synchronized with one another. Therefore, when there is not a skew between the plurality of control circuits 32, each of the plurality of switching devices 30 is supplied with an equivalent voltage obtained by dividing a potential difference between the high-voltage side reference voltage VH and the low-voltage side reference voltage VL by the number of the switching devices 30 during transiting a switching state. In other words, the plurality of control circuits 32 can make it possible not to apply an overvoltage to any one of the plurality of switching devices 30 during transiting a switching state, by removing mutual skews. LO0441 FIG. 4 shows a change of electric potential of the output port 12 and the A point shown in FIG. 1 when there is a skew between the plurality of control circuits 32 within the high-voltage side switching circuit 14. FIG. 5 shows a change of electric potential of the output port 12 and the B point shown in FIG. 1 when there is a skew between the plurality of control circuits within the low-voltage side switching circuit 16. 100451 On the other hand, when there is a skew between the plurality of control circuits 32, in the plurality of switching devices 30 as shown in FIG. 4 and FIG. 5, switching times from the change of the given control voltage to finishing the transition of switching state are deviated with respect to one another. In the plurality of switching devices 30, resistance values at the same timing during transiting switching state are different when mutual switching times are deviated. When deviance between resistance values at the same timing are large in the plurality of switching devices 30, an overvoltage is applied to any one of the switching devices 30. Particularly, if a skew between the plurality of control circuits 32 is not less than the switching time of the switching device 30, in a state where one of the switching devices 30 is short-circuited, the other switching device 30 is completely opened. LO0461 Thus, in each of the plurality of control circuits 32 within the high-voltage side switching circuit 14 and the low-voltage side switching circuit 16, a delay time from the change of the control signal to providing the control voltage according to the after-change control signal to the corresponding switching device becomes shorter than a switching time from changing the control voltage provided to the switching device to finishing the transition of switching state of the switching device in accordance with this change of the control voltage. According to this, the plurality of control circuits 32 can prevent an overvoltage from being applied to one switching device 30 because in a state where at least one switching device 30 is short-circuited, a state where the other switching device 30 is completely opened can be removed.

Figure 6:
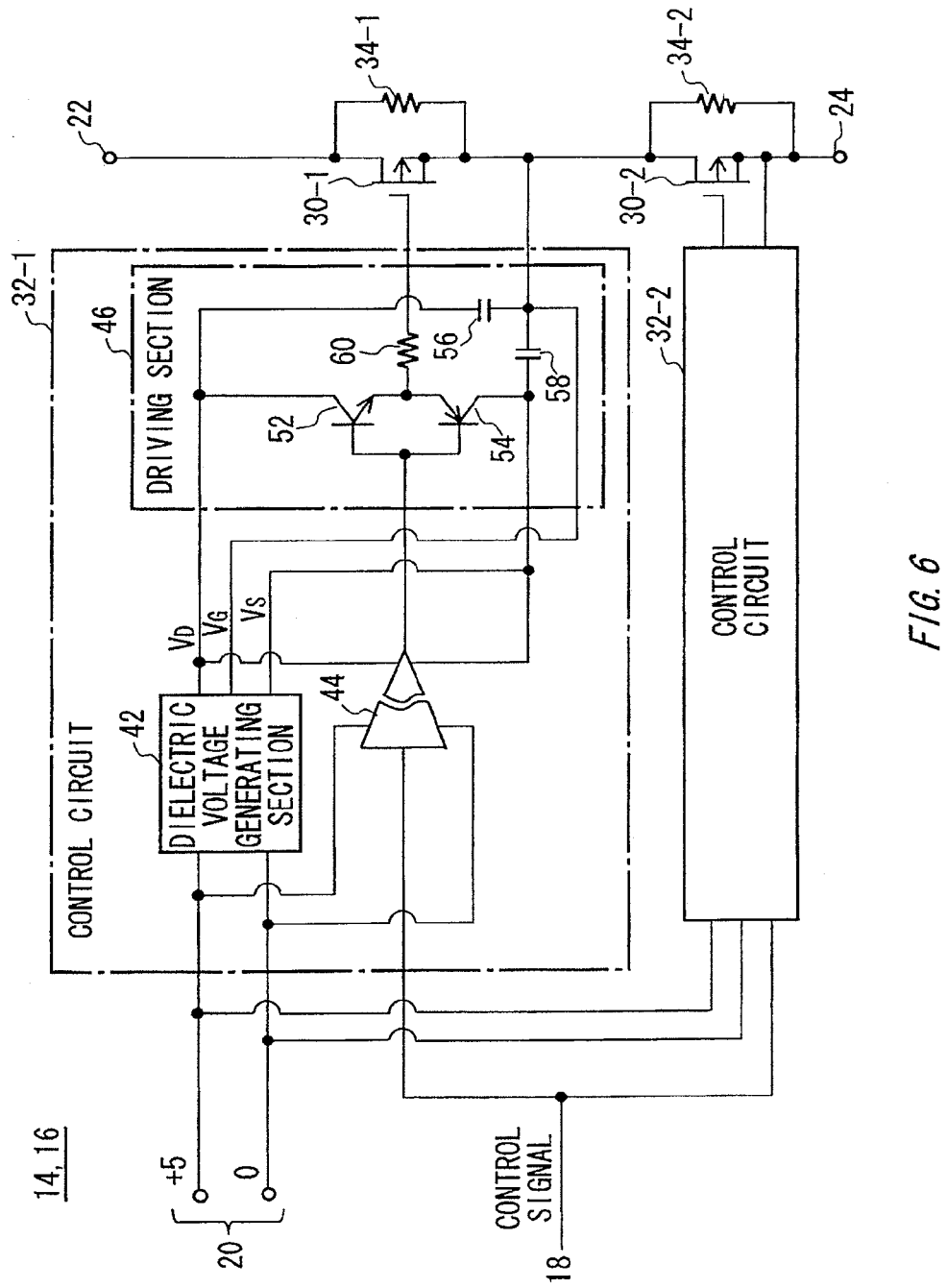
FIG. 6 shows an example of a configuration of a control circuit 32 along with a switching device 30 and a resistor 34.

FIG. 6 shows an example of a configuration of the control circuit 32 included in the high-voltage side switching circuit 14 and the low-voltage side switching circuit 16 along with the switching device 30 and the resistor 34. As an example, each of the plurality of switching devices 30 may be a plurality of field-effect transistors that is serially connected to one another, in which the serial connection is performed on drains and sources in the transistors. In addition, in FIG. 6, the switching device 30 is below referred to as an FET 30.

As an example, each of the plurality of control circuits 32 may include a driving section 46, a signal insulating section 44, and a dielectric voltage generating section 42. The driving section 46 generates a first driving voltage $V_D$ and a second driving voltage $V_S$, insulated from the operating voltage source 20 on the basis of an operating voltage supplied from the operating voltage source 20. The driving section 46 generates a reference driving voltage $V_G$, between the first driving voltage $V_D$ and the second driving voltage $V_S$. As an example, the driving section 46 may generate the reference driving voltage $V_G$, (for example, 0V), the first driving voltage $V_D$ (for example, +15V), and the second driving voltage $V_S$, (for example, −5V) on the basis of an operating voltage of +5V supplied from the operating voltage source 20. Such the driving section 46 can generate a driving voltage for switching the FET 30 to which a high voltage, e.g., above 1000V is applied on the basis of a driving voltage generated using 0V as a standard.

The signal insulating section 44 insulates a control signal input from the control section 18, and provides the insulated signal to the dielectric voltage generating section 42. In other words, the signal insulating section 44 insulates the dielectric voltage generating section 42 from the control section 18 that is a circuit for outputting the control signal. As an example, the signal insulating section 44 may be a photo coupler. Such the signal insulating section 44 can supply the control signal output from the control section 18 that operates using 0V as a reference to the dielectric voltage generating section 42 for driving the FET 30 to which a voltage, e.g., above 1000V is applied.

The dielectric voltage generating section 42 gives the first driving voltage $V_D$, or the second driving voltage $V_S$, to the switching device as a control voltage in accordance with the control signal. When turning on the FET 30 as an example (short-circuiting between a drain and a source), the dielectric voltage generating section 42 may apply the first driving voltage $V_D$ to a gate of this FET 30 and apply the reference driving voltage $V_G$, to a source thereof. Moreover, when turning off the FET 30 as an example (opening between the drain and the source), the dielectric voltage generating section 42 may apply the second driving voltage $V_S$, to the gate of this FET 30 and apply the reference driving voltage $V_G$, to the source.

Furthermore, the dielectric voltage generating section 42 may be a high-speed driving circuit in which a change time changing the control voltage from the first driving voltage $V_D$ to the second driving voltage $V_S$, is shorter than the switching time of the FET 30. According to this, the dielectric voltage generating section 42 can reduce a skew between the plurality of control circuits 32.

As an example, the dielectric voltage generating section 42 may include a first intra-driving-section switch 52, a second intra-driving-section switch 54, a first capacitor 56, and a second capacitor 58. The first intra-driving-section switch 52 opens or connects the output port of the first driving voltage $V_D$ of the driving section 46 and the gate of the corresponding FET 30 in accordance with the control signal. The second intra-driving-section switch 54 opens the output port of the second driving voltage $V_S$, of the driving section 46 and the gate of the corresponding FET 30 when the first intra-driving-section switch 52 is in a connection state, and connects the output port of the second driving voltage $V_S$, of the driving section 46 and the gate of the corresponding FET 30 when the first intra-driving-section switch 52 is in an open state.

As an example, the first intra-driving-section switch 52 may be an npn transistor of which a base is connected to the output port of the signal insulating section 44, a collector is connected to the output port of the first driving voltage $V_D$, and an emitter is connected to the gate of the corresponding FET 30 via a minute resistor 60. The second intra-driving-section switch 54 may, as an example, be a pnp transistor of which the base is connected to the output port of the signal insulating section 44, the collector is connected to the output port of the second driving voltage $V_S$, and the emitter is connected to the gate of the corresponding FET 30 via the minute resistor 60.

The first capacitor 56 is provided between the output port of the first driving voltage $V_D$ of the driving section 46 and the source of the corresponding FET 30. The second capacitor 58 is provided between the output port of the second driving voltage $V_S$, of the driving section 46 and the source of the corresponding FET 30. Moreover, the dielectric voltage generating section 42 connects the source of the corresponding FET 30 to the output port of the reference driving voltage V, in the driving section 46.

Such the dielectric voltage generating section 42 alternately switches a state where the first intra-driving-section switch 52 is turned on and the second intra-driving-section switch 54 is turned off and a state where the first intra-driving-section switch 52 is turned off and the second intra-driving-section switch 54 is turned on, in accordance with the control signal. In case of the state where the first intra-driving-section switch 52 is turned on and the second intra-driving-section switch 54 is turned off, the dielectric voltage generating section 42 applies the first driving voltage $V_D$ to the gate of the corresponding FET 30 and applies the reference driving voltage $V_G$, to the source thereof. Therefore, the dielectric voltage generating section 42 can turn on the corresponding FET 30 in accordance with the control signal. Moreover, in case of the state where the first intra-driving-section switch 52 is turned off and the second intra-driving-section switch 54 is turned on, the dielectric voltage generating section 42 applies the second driving voltage $V_S$ to the gate of the corresponding FET 30 and applies the reference driving voltage $V_G$, to the source thereof. Therefore, the dielectric voltage generating section 42 can turn off the corresponding FET 30 in accordance with the control signal.

Furthermore, when the transition has been performed from the state where the first intra-driving-section switch 52 is turned on and the second intra-driving-section switch 54 is turned off to the state where the first intra-driving-section switch 52 is turned off and the second intra-driving-section switch 54 is turned on, the first capacitor 56 passes alternating currents. Therefore, the dielectric voltage generating section 42 instantaneously applies the first driving voltage $V_D$ (for example, +15V) to the source of the corresponding FET 30, immediately after the transition is performed to the state where the first intra-driving-section switch 52 is turned off and the second intra-driving-section switch 54 is turned on. On the contrary, when the transition has been performed from the state where the first intra-driving-section switch 52 is turned off and the second intra-driving-section switch 54 is turned on to the state where the first intra-driving-section switch 52 is turned on and the second intra-driving-section switch 54 is turned off, the second capacitor 56 passes alternating currents. Therefore, the dielectric voltage generating section 42 instantaneously applies the second driving voltage $V_S$ (for example, −5V) to the source of the corresponding FET 30, immediately after the transition is performed to the state where the first intra-driving-section switch 52 is turned on and the second intra-driving-section switch 54 is turned off.

As a result, the dielectric voltage generating section 42 can apply a voltage larger than that at a normal time between the gate and the sources at the moment of the switching of the FET 30. Therefore, the dielectric voltage generating section 42 can switch the corresponding FET 30 at higher speed.

Figure 7:
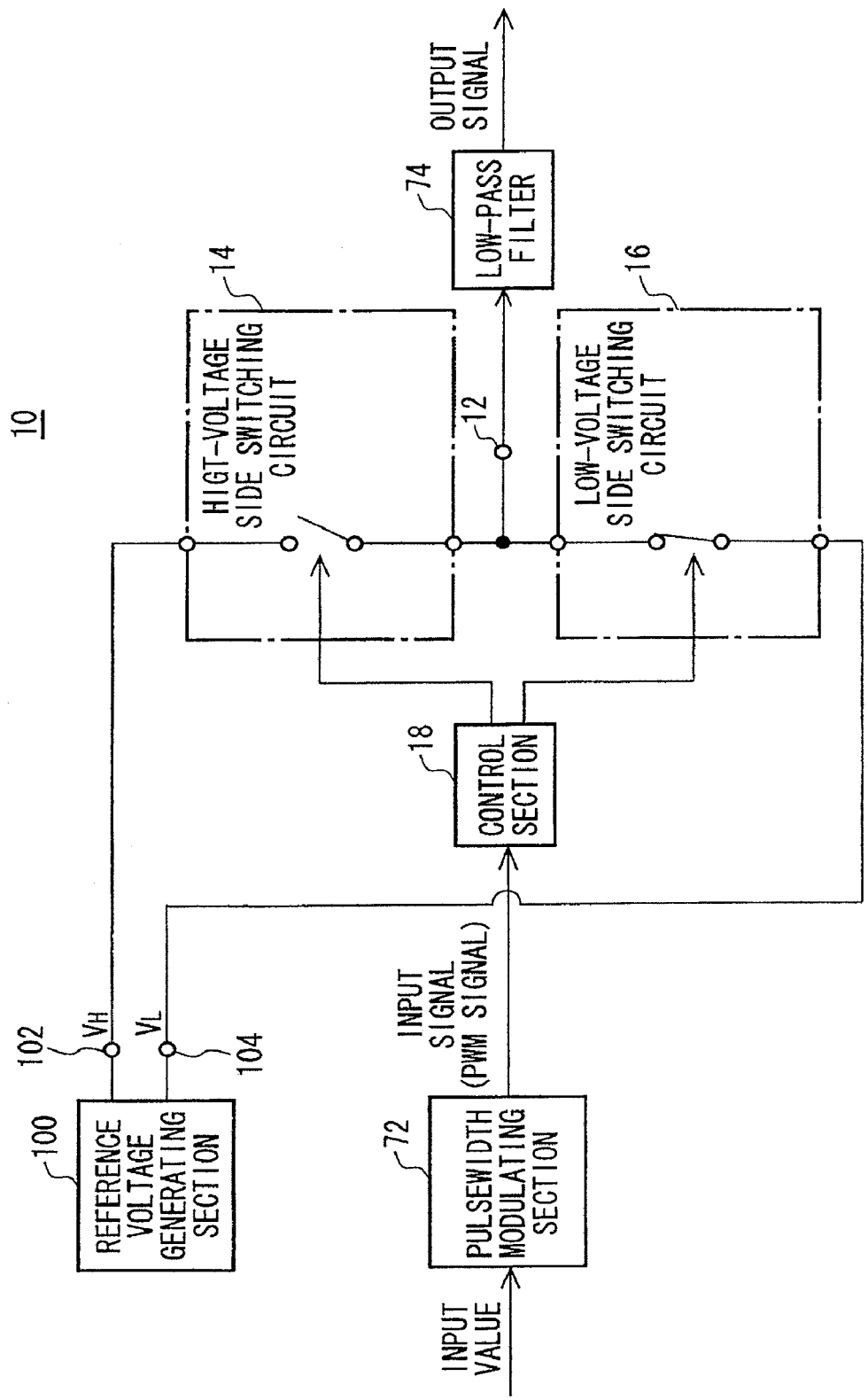
FIG. 7 shows a configuration of a signal output device 10 according to an alternative example of an embodiment of the present invention along with a reference voltage generating section 100.

FIG. 7 shows a configuration of the signal output device 10 according to an alternative example of this embodiment along with the reference voltage generating section 100. Since the signal output device 10 according to the present alternative example has the substantially same configuration and function as those of the components with the same reference numerals shown in FIG. 1, their descriptions will be omitted except the following differences.

The signal output device 10 further includes a pulse width modulating section 72 and a low-pass filter 74. The pulse width modulating section 72 outputs an input signal obtained by pulse-width modulating a given input value. The low-pass filter 74 outputs a signal obtained by low-pass filtering a voltage of the output port 12 to an outside as an output signal. The signal output device 10 according to such an alternative example can output an arbitrary-waveform output signal with a voltage swing larger than a withstand voltage of the switching device 30.

Figure 8:
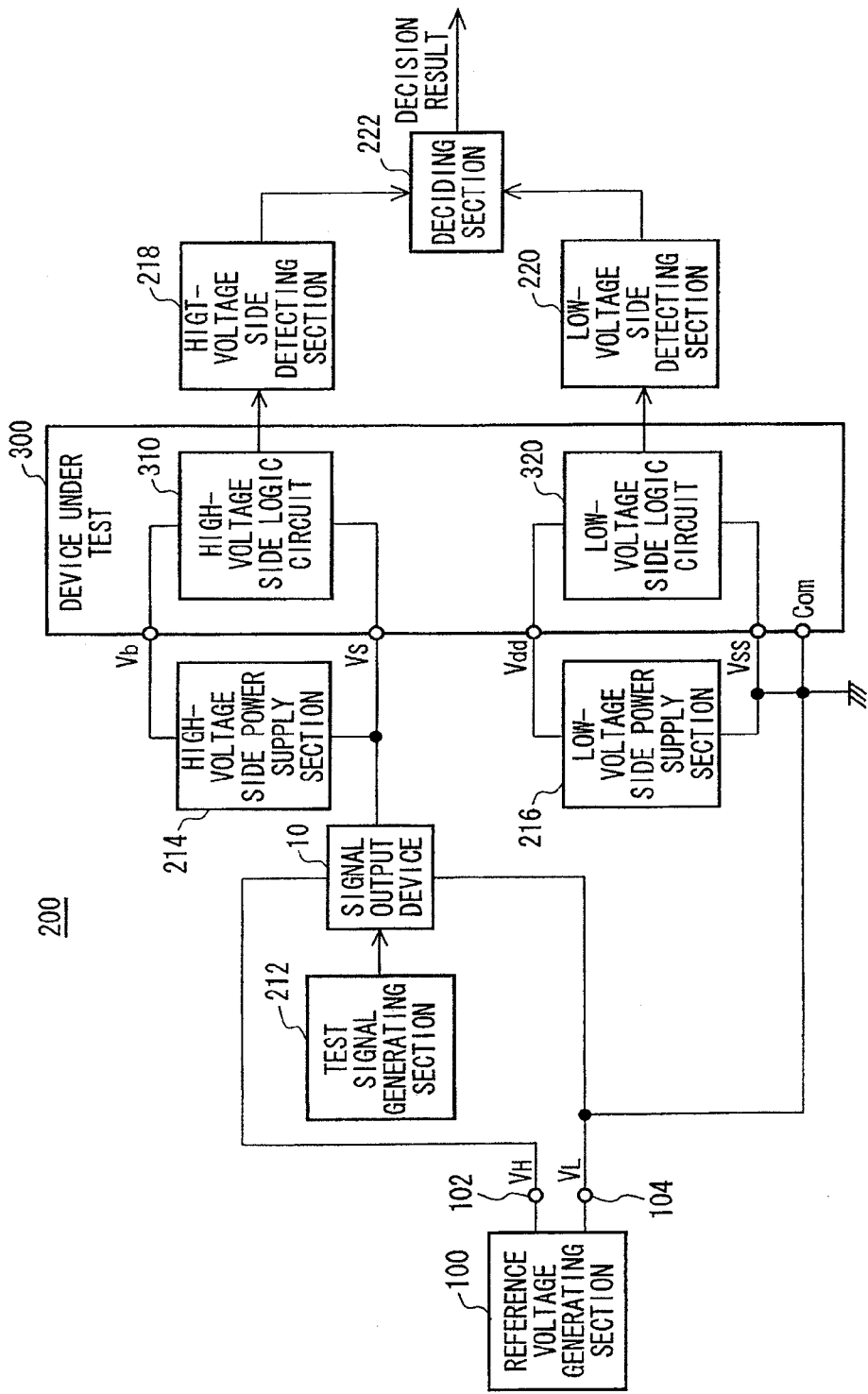
FIG. 8 shows a configuration of a test apparatus 200 according to an embodiment of the present invention along with a device under test 300.

FIG. 8 shows a configuration of a test apparatus 200 according to this embodiment along with a device under test 300. In addition, since components of FIG. 8 have the substantially same configuration and function as those of the components with the same reference numerals shown in FIGS. 1 to 7, their descriptions will be omitted except the following differences.

The test apparatus 200 tests the device under test 300. As an example, the device under test 300 may have a high-voltage side logic circuit 310 and a low-voltage side logic circuit 320. The high-voltage side logic circuit 310 and the low-voltage side logic circuit 320 operate using different electric potential as a reference,—In the present embodiment, the low-voltage side logic circuit 320 has reference electric potential relatively low compared to the high-voltage side logic circuit 310. For example, the high-voltage side logic circuit 310 operates using 2000V as a standard, and the low-voltage side logic circuit 320 operates using OV as a standard. In the present embodiment, the low-voltage side logic circuit 320 operates at the same reference electric potential as that of a circuit included in the test apparatus 200.

The test apparatus 200 includes a reference voltage generating section 100, a test signal generating section 212, a signal output device 10, a high-voltage side power supply section 214, a low-voltage side power supply section 216, a high-voltage side detecting section 218, a low-voltage side detecting section 220, and a deciding section 222. The reference voltage generating section 100 has the substantially same configuration and function as those of the reference voltage generating section 100 shown in FIG. 1. The high-voltage side reference voltage generating port 104 is connected to a ground terminal of the test apparatus 200, and is also connected to a sink-side power source terminal Vss of the low-voltage side logic circuit 320 and a reference potential terminal Com of the device under test 300. According to this, the low-voltage side logic circuit 320 can operate using the ground potential of the test apparatus 200 as a standard.

The test signal generating section 212 generates a test signal specifying a waveform of the output signal supplied to the device under test 300. As an example, the test signal generating section 212 may generate a test signal specifying a waveform of the output signal given as reference potential of the high-voltage side logic circuit 310.

The signal output device 10 outputs an output signal according to the test signal to the device under test 300. Since the signal output device 10 has a configuration and a function similar to those of the signal output device 10 shown in FIG. 1 or 7, their descriptions will be omitted except the following differences. As an example, the signal output device 10 supplies the output signal to the sink-side power source terminal V, of the high-voltage side logic circuit 310. According to this, the high-voltage side logic circuit 310 can operate using electric potential of the output signal output from the signal output device 10 as a standard.

The high-voltage side power supply section 214 generates a power supply voltage for driving the high-voltage side logic circuit 310 using the electric potential of the output signal output from the signal output device 10 as a standard. The high-voltage side power supply section 214 generates, e.g., a voltage of +15V as a power supply voltage. In the present embodiment, the high-voltage side power supply section 214 applies the generated power supply voltage to the source-side power source terminal Vb of the high-voltage side logic circuit 310.

The low-voltage side power supply section 216 generates a power supply voltage for driving the low-voltage side logic circuit 320 using electric potential of the low-voltage side reference voltage VL output from the reference voltage generating section 100 as a standard. The low-voltage side power supply section 216 generates, e.g., a voltage of +15V as a power supply voltage. In the present embodiment, the low-voltage side power supply section 216 applies the generated power supply voltage to the source-side power source terminal Vdd of the low-voltage side logic circuit 320.

The high-voltage side detecting section 21 8 detects a signal output from the high-voltage side logic circuit 310 of the device under test 300 in accordance with the output signal, and outputs a detection result. The high-voltage side detecting section 218 is an example of a detecting section according to the present invention. The low-voltage side detecting section 220 detects a signal output from the low-voltage side logic circuit 320 of the device under test 300 in accordance with the output signal, and outputs a detection result. The low-voltage side detecting section 220 is an example of a detecting section according to the present invention. 100681 The deciding section 222 decides whether the device under test 300 normally operates on the basis of the detection result detected by at least one of the high-voltage side detecting section 218 and the low-voltage side detecting section 220. In other words, the deciding section 222 decides whether an operation result output from the device under test 300 according to the output signal is normal.

The test apparatus 200 with the configuration as described above can supply an output signal having a voltage swing larger than a withstand voltage of the switching device 30 included in the signal output device 10 to the device under test 300 and test the device under test 300. For example, the test apparatus 200 may perform the following test on the device under test 300.

First, the test signal generating section 212 changes a voltage of the output signal output from the signal output device 10 to change the reference potential of the high-voltage side logic circuit 310. As an example, the test signal generating section 212 gradually raises or drops the voltage of the output signal. At least one of the high-voltage side detecting section 218 and the low-voltage side detecting section 220 detects the signal output from the device under test 300 in accordance with the output signal, and outputs a detection result. Then, the deciding section 222 decides a quality of the device under test 300 on the basis of the detection result.

More specifically, the deciding section 222 may detect whether there is a timing at which a consumption current of the device under test 300 suddenly rises in accordance with the fact that the test signal generating section gradually raises (drops) the voltage of the output signal. According to this, for example, the test apparatus 200 can detect that a part of transistors of the device under test 300 has malfunction and thus a large penetrating current flows, in accordance with the fact that a voltage above a certain value is applied.

Moreover, as another test, the test apparatus 200 may perform the next test on the device under test 300. First, the test signal generating section 212 changes the voltage of the output signal output from the signal output device 10 to change the reference potential of the high-voltage side logic circuit 31 0 in the first test. At least one of the high-voltage side detecting section 218 and the low-voltage side detecting section 220 detects the signal output from the device under test 300 in accordance with the output signal, and outputs a detection result.

Subsequently, the test signal generating section 212 changes the voltage of the output signal output from the signal output device 10 at a speed different from that of the first test in order to change the reference potential of the high-voltage side logic circuit 310 in the second test. At least one of the high-voltage side detecting section 218 and the low-voltage side detecting section 220 detects the signal output from the device under test 300 in accordance with the output signal, and outputs a detection result.

Then, the deciding section 222 decides a quality of the device under test 300 on the basis of the detection results by the first test and the second test. As an example, the deciding section 222 may compare the detection results by the first test and the second test and decide a quality of the device under test 300. According to this, the device under test 300 can detect malfunction according to fluctuation of a power supply voltage.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A test apparatus that tests a device under test, comprising:
   a signal output device that outputs an output signal according to a test signal to the device under test; and
   a detecting section that detects a signal output from the device under test in accordance with the output signal and outputs a detection result,
   the signal output device comprising:
      an output port that outputs the output signal;
      a high-voltage side switching circuit that opens or short-circuits between a first terminal connected to a high-voltage side reference voltage generating port for outputting a high-voltage side reference voltage and a second terminal connected to the output port in accordance with a first control signal;
      a low-voltage side switching circuit that opens or short-circuits between a first terminal connected to the output port and a second terminal connected to a low-voltage side reference voltage generating port for outputting a low-voltage side reference voltage lower than the high-voltage side reference voltage in accordance with a second control signal; and
      a control section that outputs the first control signal and the second control signal according to a logical value shown by the input signal causing the high-voltage side switching circuit to be opened when the low-voltage side switching circuit is being short-circuited and causing the low-voltage side switching circuit to be opened when the high-voltage side switching circuit is being short-circuited, and
      each of the high-voltage side switching circuit and the low-voltage side switching circuit comprising:
      a plurality of switching devices that is serially connected between the first terminal and the second terminal and each of which is opened or short-circuited in accordance with a provided control voltage; and
      control circuits that is provided corresponding to the plurality of switching devices, which provides a control voltage according to the control signal to the corresponding switching device, and that opens and short-circuits the plurality of switching devices substantially in synchronization with each other, wherein a voltage inputted to the first terminal is outputted from the second terminal by short-circuiting between the first terminal and the second terminal.

2. The test apparatus as claimed in claim 1, wherein
   the plurality of control circuits is provided one-to-one corresponding to the plurality of switching devices, and
   each of the plurality of control circuits operates so that a delay time from a change of the control signal to providing the control voltage according to the after-change control signal to the corresponding switching device is shorter than a switching time from a change of the control voltage provided to the switching device to finishing a transition of a switching state of the switching device in accordance with this change of the control voltage.

3. The test apparatus as claimed in claim 2, wherein
   each of the plurality of control circuits has a driving section that provides a first driving voltage or a second driving voltage to the switching device as the control voltage in accordance with the control signal, and
   the driving section operates so that a change time changing the control voltage from the first driving voltage to the second driving voltage is shorter than the switching time of the switching device.

4. The test apparatus as claimed in claim 3, wherein each of the plurality of control circuits further has a signal insulating section that insulates the driving section from a circuit for outputting the control signal.

* * * * *